(12) United States Patent
Jones et al.

(10) Patent No.: US 7,129,169 B2
(45) Date of Patent: Oct. 31, 2006

(54) METHOD FOR CONTROLLING VOIDING AND BRIDGING IN SILICIDE FORMATION

(75) Inventors: Bradley P. Jones, Pleasant Valley, NY (US); Christian Lavoie, Ossining, NY (US); Robert J. Purtell, Mohegan Lake, NY (US); Yun-Yu Wang, Poughquag, NY (US); Keith Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 46 days.

(21) Appl. No.: 10/709,534

(22) Filed: May 12, 2004

(65) Prior Publication Data

US 2005/0255699 A1 Nov. 17, 2005

(51) Int. Cl.
*H01L 21/44* (2006.01)
*H01L 21/3205* (2006.01)

(52) U.S. Cl. ............................ 438/685; 257/E21.593
(58) Field of Classification Search ............. 438/592, 438/652, 685
See application file for complete search history.

(56) References Cited

U.S. PATENT DOCUMENTS

| | | | |
|---|---|---|---|
| 4,983,544 A | 1/1991 | Lu et al. | |
| 5,567,652 A * | 10/1996 | Nishio | 438/555 |
| 5,672,543 A * | 9/1997 | Chang et al. | 438/653 |
| 5,783,486 A | 7/1998 | Tseng | |
| 5,970,370 A * | 10/1999 | Besser et al. | 438/586 |
| 6,136,705 A * | 10/2000 | Blair | 438/682 |
| 6,207,563 B1 * | 3/2001 | Wieczorek et al. | 438/664 |
| 6,251,711 B1 | 6/2001 | Fang et al. | |
| 6,316,323 B1 | 11/2001 | Fang et al. | |
| 6,329,276 B1 * | 12/2001 | Ku et al. | 438/586 |
| 6,344,411 B1 * | 2/2002 | Yamada et al. | 438/653 |
| 6,388,327 B1 * | 5/2002 | Giewont et al. | 257/754 |
| 6,410,429 B1 * | 6/2002 | Ho et al. | 438/655 |
| 6,440,851 B1 | 8/2002 | Agnello et al. | |
| 6,627,527 B1 | 9/2003 | Wang et al. | |
| 6,657,244 B1 | 12/2003 | Dokumaci et al. | |
| 6,773,978 B1 * | 8/2004 | Besser et al. | 438/238 |
| 6,878,627 B1 * | 4/2005 | Lur et al. | 438/683 |
| 6,916,729 B1 * | 7/2005 | Fang et al. | 438/583 |
| 2002/0031915 A1 * | 3/2002 | Ito | 438/721 |
| 2003/0222320 A1 | 12/2003 | Nozaki | |
| 2005/0156208 A1 * | 7/2005 | Lin et al. | 257/288 |

* cited by examiner

*Primary Examiner*—W. David Coleman
(74) *Attorney, Agent, or Firm*—Cantor Colburn LLP

(57) ABSTRACT

A method for forming a metal silicide contact for a semiconductor device includes forming a refractory metal layer over a substrate, including active and non-active area of said substrate, and forming a cap layer over the refractory metal layer. A counter tensile layer is formed over the cap layer, wherein the counter tensile layer is selected from a material such that an opposing directional stress is created between the counter tensile layer and the cap layer, with respect to a directional stress created between the refractory metal layer and the cap layer.

6 Claims, 3 Drawing Sheets

METHOD FOR CONTROLLING VOIDING AND BRIDGING IN SILICIDE FORMATION

BACKGROUND OF INVENTION

The present invention relates generally to semiconductor manufacturing processes, and, more particularly, to a method for controlling voiding and bridging in silicide formation.

In the manufacture of semiconductor devices, salicide (or self-aligned silicide) materials are formed upon gate conductors and diffusion regions to reduce the line resistance of a CMOS device, thereby improving the speed characteristics thereof. In salicide technology, a refractory metal or a near noble metal, such as titanium for example, is deposited on a silicon substrate. The deposited titanium is then annealed, thereby forming a silicide layer only on the exposed areas of the substrate. The areas of unreacted titanium left on the dielectric may then be selectively etched away without a masking step. Thus, the process is "self-aligning."

As circuit devices have continued to shrink in size, however, it has been found that titanium silicide ($TiSi_2$) becomes an unsatisfactory silicide material since the sheet resistance thereof begins to sharply increase when the linewidth of the device decreases below 0.20 µm. More recently, cobalt disilicide ($CoSi_2$) has been used as a replacement for titanium in salicide structures since it does not suffer from a linewidth dependent sheet resistance problem. On the other hand, the use of cobalt silicide structures is not without its own drawbacks. For example, unlike titanium, a cobalt layer requires a cap layer such as titanium nitride (TiN) due to the sensitivity of cobalt to contaminants during the annealing process.

When cobalt reacts with silicon on the active areas of a device, there is a dimensional reduction of the material from that of the original cobalt metal-free surface due to material densification during silicide formation. In other words, if one (volumetric) unit of metal is deposited on the top and sides of a gate structure, for example, after the silicidation process, the overall height and width of the structure will shrink depending on the extent of reaction on specific planes of the structure. These dimensional changes for different parts of the device structure require that the protective cap deposited over the silicide metal either flex due to changes in different areas of the device below, or allow voids to open up in certain locations thereunder to compensate for volumetric changes occurring at various points below the cap. Unfortunately, the differential stresses, voiding and/or delamination that can occur could allow silicon and/or metal to move into undesired areas, resulting in subsequent voiding and electrical bridging.

SUMMARY OF INVENTION

The foregoing discussed drawbacks and deficiencies of the prior art are overcome or alleviated by a method for reducing voiding between a first layer and a second layer formed over the first layer during a semiconductor annealing process. In an exemplary embodiment, the method includes forming a counter tensile layer over the second layer, wherein said counter tensile layer is selected from a material such that an opposing directional stress is created between the counter tensile layer and the second layer, with respect to a directional stress created between the first layer and the second layer.

In another embodiment, a method for forming a metal silicide contact for a semiconductor device includes forming a refractory metal layer over a substrate, including active and non-active area of said substrate, and forming a cap layer over the refractory metal layer. A counter tensile layer is formed over the cap layer, wherein the counter tensile layer is selected from a material such that an opposing directional stress is created between the counter tensile layer and the cap layer, with respect to a directional stress created between the refractory metal layer and the cap layer.

BRIEF DESCRIPTION OF DRAWINGS

Referring to the exemplary drawings wherein like elements are numbered alike in the several Figures.

DETAILED DESCRIPTION

Disclosed herein is a method for controlling voiding and bridging in silicide formation. Briefly stated, the method addresses the mechanical properties of a silicide cap layer with respect to the underlying formed silicide layer. As a result of the mechanical energy build up due to metal/cap deflection following the anneal induced volumetric changes in the silicided material, voids and/or bridging can occur during deflection of the layers. In order to counteract these effects, a counter tensile layer is also formed over the cap layer, wherein the counter layer is selected so as to provide an opposing mechanical force with respect to the deflection of the cap layer and silicide layer. Accordingly, a reduced mechanical energy buildup in the layers leads to a reduced deflection therein, and will thus reduce the tendency to create voiding, bridging and/or delamination.

Figure 1A:
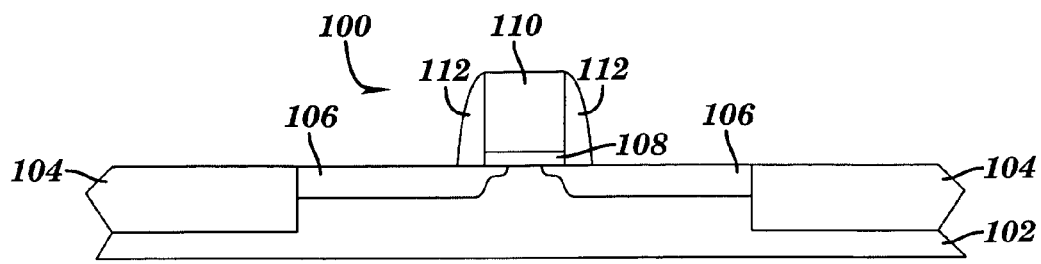
FIGS. 1(a) through 1(c) are cross sectional views of an existing silicide formation process that can lead to the creation of bridging and/or voiding.
Figure 1B:
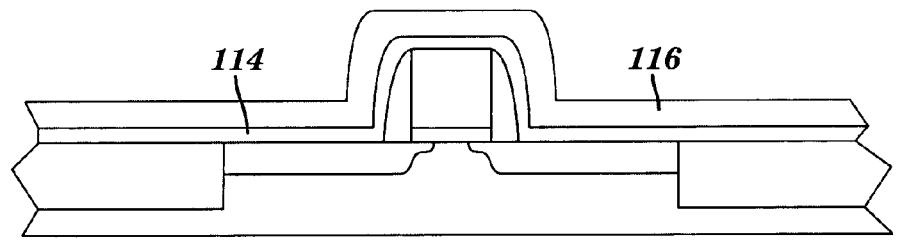
Figure 1C:
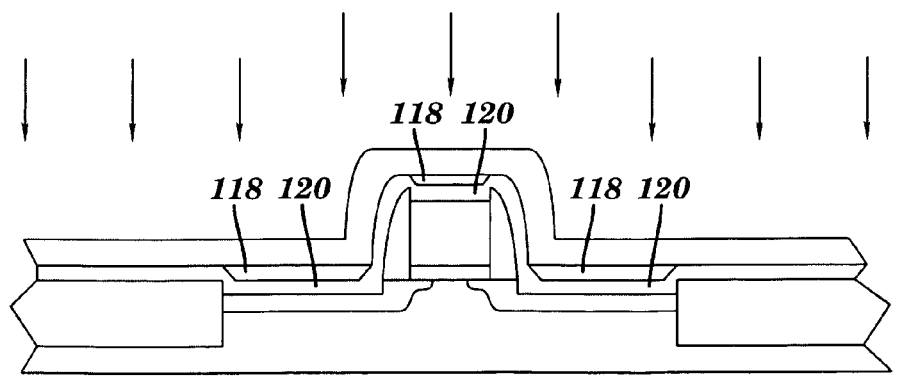

Referring initially to FIGS. 1(a) through 1(c), there is shown a series of cross sectional views of an existing silicide formation process implemented, for example, on a CMOS transistor device. As will be recognized by one skilled in the art, FIG. 1(a) illustrates a transistor device 100 formed on a semiconductor substrate 102 (e.g., silicon) and electrically isolated from neighboring devices (not shown) by a pair of isolation regions 104. Source/drain diffusion regions 106 are defined within the substrate 102 by implantation of an appropriate dopant species, depending upon the polarity of the device. In addition, a gate is defined by the stack including a gate dielectric 108 (e.g., oxide) and a gate conductor 110 (e.g., doped polysilicon). Sidewall spacers 112 on the sides of the gate stack are also illustrated in FIG. 1(a).

As stated previously, metal suicides are used in the formation of the gate, source and drain electrodes of integrated circuit elements. Thus, in FIG. 1(b), a layer of refractory metal 114, such as cobalt, is formed over the entire surface of the device, followed by a cap layer 116 of (for example) TiN. Both the refractory metal layer 114 and the cap layer 116 may be sequentially deposited, for example, by sputtering. As shown in FIG. 1(c), a high-temperature thermal annealing treatment (represented by arrows) is carried out so as to form silicide in areas where there is silicon available to react with the metal of layer 114

(i.e., the top of the source/drain diffusion regions 106 and the gate conductor 110). No silicide forms in other areas of the wafer, such as where there is $SiO_2$ or nitride present.

As also stated previously, the volumetric reduction of the reacted cobalt results in stored mechanical energy within the Co/TiN film stack. Depending on the relative thickness of the cobalt and cap layers, delamination or voiding can occur as a result of the differential stresses. A plurality of voids 118 are thus illustrated between the cap layer 116 and newly formed silicide regions 120.

Figure 2:
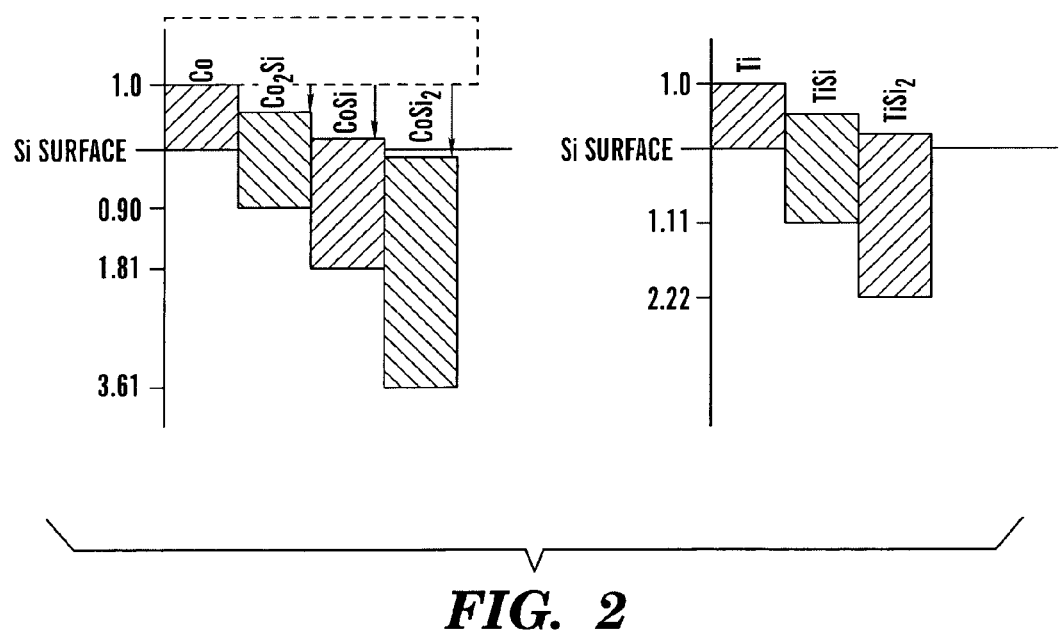
FIG. 2 is a graph illustrating volumetric changes for both a Co/TiN system and a Ti/TiN system after an annealing and phase change process.

This phenomenon is further illustrated by the graphs in FIG. 2 of the volumetric changes for both a Co/TiN system and a Ti/TiN system after an annealing and phase change process. At a uniform stress, $\sigma$, the elastic strain energy density is given by $\sigma^2/2E$, wherein E is the elastic modulus. One way for this strain energy to be released is through delamination (i.e., a physical separation between the silicide areas and the cap layer). The critical film thickness for delamination is defined at the point at which the strain energy becomes greater than the interfacial energy. In particular, this occurs when the film thickness is greater than a critical thickness, as shown by the following equation:

$$t_{crit} = 2\ \gamma E/\sigma^2 \quad \text{(eq. 1)}$$

In the example illustrated, where the adhesion force of the cobalt to TiN is greater than that of cobalt to the sidewall spacers, the thickness of the combined Co/TiN film layers must be less than the value of $t_{crit}$ determined by equation 1 to prevent delamination. Therefore, this may be achieved, in one approach, by thinning the TiN cap layer 116 to a thickness that will both prevent delamination, but will still also prevent oxygen from diffusing through the film during reaction and inhibit silicide formation. By way of example, in reducing the film ratio of an existing process of record from about 7 nm Co:20 nm TiN to about 7 nm Co:17 nm TiN, a decrease in stored mechanical energy is achieved. Another approach is to reduce the thickness of both the Co and TiN layer to, for example, a ratio of about 6 nm Co:15 nm TiN. Even further reductions in thickness in the Co layer may also be implemented (e.g., 4–5 nm) as it has been shown that there is less open circuiting (voiding) in the silicide areas at a reduced applied thickness of cobalt.

Figure 3A:
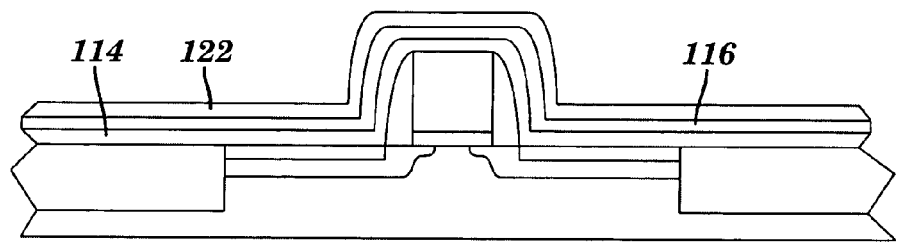
FIGS. 3(a) through 3(c) are cross sectional views of a method for controlling voiding and bridging in silicide formation, in accordance with an embodiment of the invention.
Figure 3B:
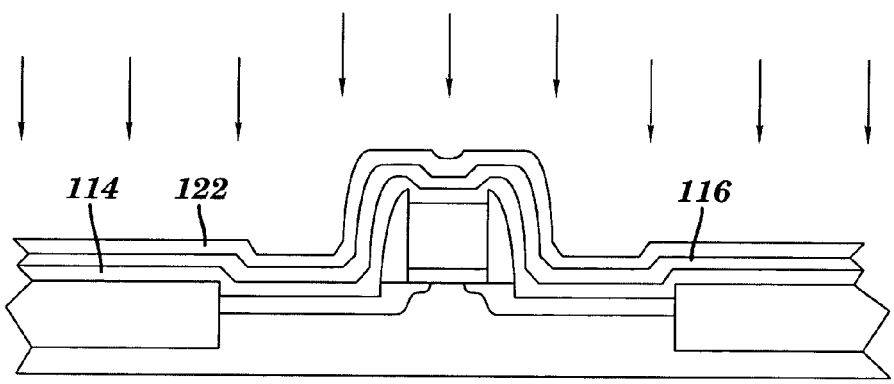
Figure 3C:
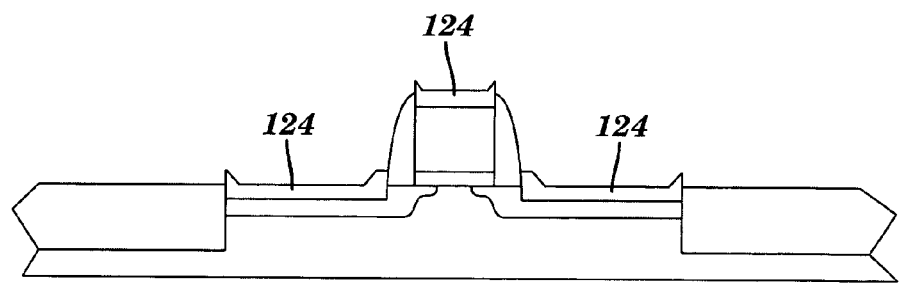

Referring generally now to FIGS. 3(a) through 3(c), there is shown a series of cross sectional views illustrating a method for controlling voiding and bridging in silicide formation, in accordance with an embodiment of the invention. Following the formation of cap layer 116 in FIG. 3(a), it is seen that a counter tensile layer 122 is formed over the cap layer 116. The counter tensile layer 122 is selected such that it results in an opposing directional stress on the TiN cap layer 116 with respect to the stress created between the cap layer 116 and metal layer 114. Thus, although the addition of the counter tensile layer 122 adds an increased overall thickness to the resulting layered structure (assuming metal layer 114 and cap layer 116 are formed at process of record thicknesses), the structure now has less mechanical stress associated therewith. As such, a sufficiently thick oxygen barrier is provided, yet the mechanical properties of the layered structure are modified so as to also prevent delamination.

In an exemplary embodiment, the counter tensile layer 122 is chosen to be the same material as used for the refractory metal layer 114 (e.g., cobalt). Such a selection also has the advantage of simplifying the process itself, since no additional tooling would be needed. Furthermore, the combined thickness of the cap layer 116 and the counter tensile layer 122 can be roughly equivalent to the thickness of just the cap layer in the prior process of record. By increasing the thickness of a tensile Co film on top of the compressive TiN film, the net stored energy in the film can be reduced. If for example, the top layer of Co is made thick enough while the TiN film is formed thin enough, then the resultant net stored energy can be reduced to almost zero. In one embodiment, the refractory metal layer 114 is formed at a thickness of about 4 to about 7 nanometers, while the cap layer 116 is formed at a thickness of about 10 to about 20 nanometers, and said counter tensile layer is formed at a thickness of about 10 to about 30 nanometers. In another embodiment, the refractory metal layer 114 is formed at a thickness of about 4 to about 7 nanometers, while the cap layer and the counter tensile layer are formed at a combined thickness of about 15 to about 30 nanometers.

As shown in FIG. 3(b), after the annealing step, the net stored energy in the resulting silicide/TiN/Co film is reduced, thus preventing void formation that could otherwise also lead to bridging. Finally, in FIG. 3(c), the counter tensile layer 122, cap layer 116 and unreacted portions of the original cobalt metal layer 114 are selectively removed through one or more etch processes, thereby completing the silicidation process to form salicided (self aligned) electrode contacts 124.

It will be appreciated that, in addition to the above discussed techniques, the tendency for delamination could also be reduced by increasing the adhesional forces between the deposited metal in the insulating surfaces. Such techniques could include, for example, by interface roughening, cleaning of etch residues to promote bonding of the metal to the insulator, adjusting the taper angle of the insulator surface adjacent to the silicon to reduce localized stress build up, and adjusting the cool down temperature rate to reduce thermal shocks which might cause film delamination.

Moreover, the differential forces induced in the capping layer by selective silicidation might also result in cracking if the hardness of the protective cap were too great. This effect could further result in selective delamination of the cap near the cracked area, and would be particularly worsened if oxygen were present in the background ambient. In such a case (if prevention of cap failure were not feasible), a gettering layer, such as Ti, could also be applied above the TiN cap layer.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for reducing voiding between a first layer and a second layer formed over said first layer during a semiconductor annealing process, the method comprising:

forming a counter tensile layer over said second layer, said second layer comprising a titanium nitride cap layer, wherein said counter tensile layer is selected from a material such that an opposing directional stress is created between said counter tensile layer and said second layer, with respect to a directional stress created between said first layer and said second layer, wherein said counter tensile layer and said first layer comprise cobalt.

2. A method for forming a metal silicide contact for a semiconductor device, the method comprising:
   forming a refractory metal layer over a substrate, including active and non-active area of said substrate;
   forming a cap layer over said refractory metal layer; and
   forming a counter tensile layer over said cap layer, wherein said counter tensile layer is selected from a material such that an opposing directional stress is created between said counter tensile layer and said cap layer, with respect to a directional stress created between said refractory metal layer and said cap layer, and wherein said counter tensile layer and said and said refractory metal layer comprise cobalt.

3. The method of claim 2, wherein said cap layer comprises a titanium nitride cap layer.

4. The method of claim 2, wherein:
   said refractory metal layer is formed at a thickness of about 4 to about 7 nanometers;
   said cap layer is formed at a thickness of about 10 to about 20 nanometers; and
   said counter tensile layer is formed at a thickness of about 10 to about 30 nanometers.

5. The method of claim 2, wherein:
   said refractory metal layer is formed at a thickness of about 4 to about 7 nanometers;
   said cap layer and said counter tensile layer are formed at a combined thickness of about 15 to about 30 nanometers.

6. The method of claim 2, further comprising annealing the substrate so as to cause portions of said refractory metal layer to react with active areas of said substrate.

* * * * *